(12) United States Patent
Oh et al.

(10) Patent No.: US 11,308,006 B2
(45) Date of Patent: Apr. 19, 2022

(54) MEMORY RANK DESIGN FOR A MEMORY CHANNEL THAT IS OPTIMIZED FOR GRAPH APPLICATIONS

(71) Applicant: Intel Corporation, Santa Clara, CA (US)

(72) Inventors: Byoungchan Oh, Hillsboro, OR (US); Sai Dheeraj Polagani, Hillsboro, OR (US); Joshua B. Fryman, Corvallis, OR (US)

(73) Assignee: Intel Corporation, Santa Clara, CA (US)

( * ) Notice: Subject to any disclaimer, the term of this patent is extended or adjusted under 35 U.S.C. 154(b) by 209 days.

(21) Appl. No.: 16/833,322

(22) Filed: Mar. 27, 2020

(65) Prior Publication Data

US 2020/0233819 A1 Jul. 23, 2020

(51) Int. Cl.
| | |
|---|---|
| *G06F 13/16* | (2006.01) |
| *G06F 13/42* | (2006.01) |
| *G06F 12/0879* | (2016.01) |
| *G11C 11/4093* | (2006.01) |
| *G11C 5/04* | (2006.01) |
| *G11C 29/42* | (2006.01) |

(52) U.S. Cl.
CPC ...... *G06F 13/1668* (2013.01); *G06F 12/0879* (2013.01); *G06F 13/4239* (2013.01); *G11C 5/04* (2013.01); *G11C 11/4093* (2013.01); *G11C 29/42* (2013.01); *G11C 2207/2254* (2013.01)

(58) Field of Classification Search
CPC ............ G06F 13/1668; G06F 12/0879; G06F 13/4239; G11C 5/04; G11C 11/4093; G11C 29/42; G11C 2207/2254
See application file for complete search history.

(56) References Cited

U.S. PATENT DOCUMENTS

| | | | |
|---|---|---|---|
| 10,482,947 B2* | 11/2019 | Cox | G11C 11/408 |
| 2009/0049365 A1* | 2/2009 | Kim | G06F 11/1012 |
| | | | 714/767 |
| 2013/0262956 A1* | 10/2013 | Haywood | G06F 11/1048 |
| | | | 714/758 |
| 2016/0284424 A1* | 9/2016 | Das | G11C 29/52 |
| 2018/0254079 A1* | 9/2018 | Cox | G06F 11/1048 |
| 2019/0042499 A1* | 2/2019 | McCall | G06F 13/1684 |
| 2019/0043552 A1* | 2/2019 | Alameer | G11C 11/4093 |
| 2019/0171520 A1* | 6/2019 | Cadigan | G06F 11/1048 |

* cited by examiner

*Primary Examiner* — Kyle Vallecillo
(74) *Attorney, Agent, or Firm* — Compass IP Law PC

(57) ABSTRACT

An apparatus is described. The apparatus includes a rank of memory chips to couple to a memory channel. The memory channel is characterized as having eight transfers of eight bits of raw data per burst access. The rank of memory chips has first, second and third X4 memory chips. The X4 memory chips conform to a JEDEC dual data rate (DDR) memory interface specification. The first and second X4 memory chips are to couple to an eight bit raw data portion of the memory channel's data bus. The third X4 memory chip to couple to an error correction coding (ECC) information portion of the memory channel's data bus.

20 Claims, 8 Drawing Sheets

MEMORY RANK DESIGN FOR A MEMORY CHANNEL THAT IS OPTIMIZED FOR GRAPH APPLICATIONS

STATEMENT OF GOVERNMENT RIGHTS

This invention was made with government support under Agreement No. HR0011-17-3-0004 awarded by DARPA. The government has certain rights in the invention.

FIELD OF INVENTION

The field of invention pertains generally to the computing sciences, and, more specifically, to a memory rank design for a memory channel that is optimized for graph applications.

BACKGROUND

Harvard architecture computer systems execute program code in a processing core that fetches instructions and data from a memory to "feed" the executing code. Different types of programs, however, will perform better if the architecture of the underlying memory resources are optimized in view of how the programs access these memory resources

FIGURES

A better understanding of the present invention can be obtained from the following detailed description in conjunction with the following drawings, in which.

DETAILED DESCRIPTION

Figure 1:
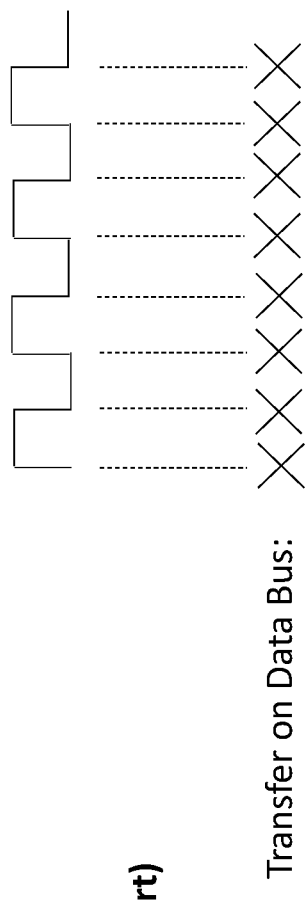
FIG. 1 shows a traditional memory channel (prior art)
Figure 1:
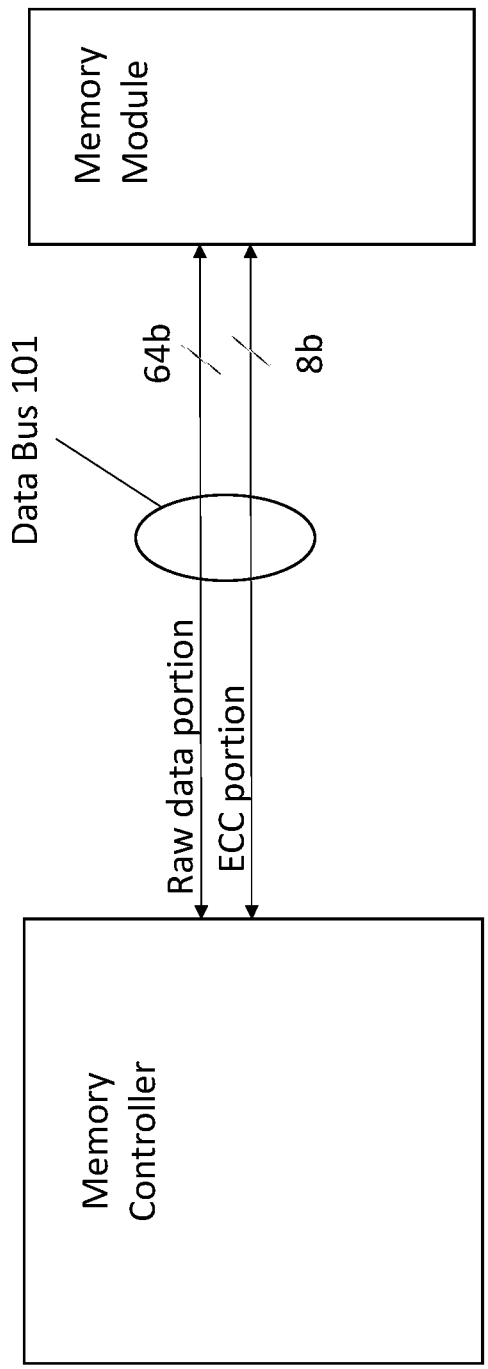

FIG. 1 depicts a traditional computer main memory system architecture 100. As observed in FIG. 1, the main memory system 100 includes a memory channel whose data bus 101 is 72 bits (72b) wide. Traditionally, 64 bits (64b) of the 72 bit (72b) bus are used for raw data (raw data portion of the data bus) while 8 bits (8b) are used for error correction code (ECC) protection (ECC portion of the data bus). Data accesses have traditionally been implemented in eight cycle bursts. That is, the standard mechanism for accessing memory is to read or write data as eight transfers of 72b (again, 64b of data and 8b of ECC). Thus, raw data is commonly accessed in bursts of 64 bytes (64b/transfer×8 transfers=64 bytes (64B)).

Here, the central processing unit (CPU) cores of modern computers commonly cache data in units of 64 bytes (64B). One unit of 64 B is commonly referred to as a cache line. Thus, the traditional main memory access in a 64 B burst as described just above (64b/transfer×8 transfers) corresponds to the access of one CPU cache line.

Here, traditional software applications commonly operate on data with "spatial and temporal locality" meaning data items that physically stored near one another in main memory are commonly operated on in the same timeframe. As such, accessing data from main memory in large 64B chunks does not result in the system accessing too much memory data per access (commonly, much of the data in a cache line is processed by a CPU core in a same timefream).

Unfortunately, some specific applications, such as graph related applications, do not follow the spatial and temporal locality paradigm. Here, such applications tend to need, in a same timeframe, smaller units of data whose respective storage locations are scattered across main memory. As such, a new architecture referred to as the programmable unified memory architecture (PUMA), refines main memory accesses (or any memory accesses) to 8 byte (8B) chunks of raw data rather than 64B chunks of raw data. Graph related applications can be performed by a graphics processing unit (GPU). Thus at least some foreseen applications of PUMA include computer systems having at least one GPU.

Figure 2A:
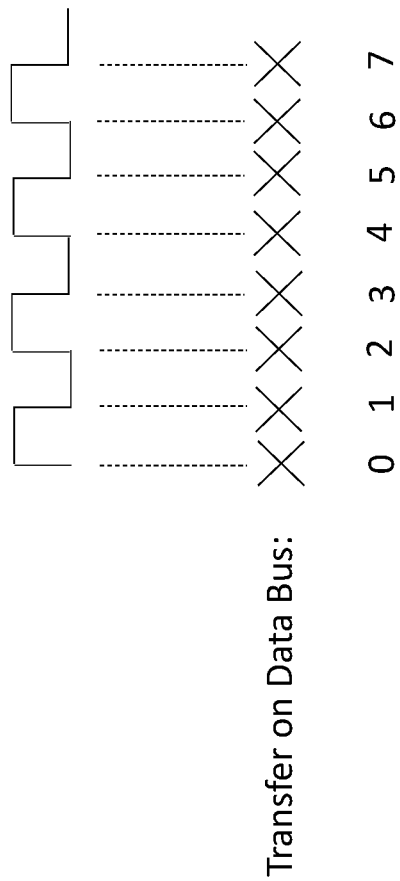
FIGS. 2a and 2b depicts aspects of a programmable unified memory architecture (PUMA)
Figure 2A:
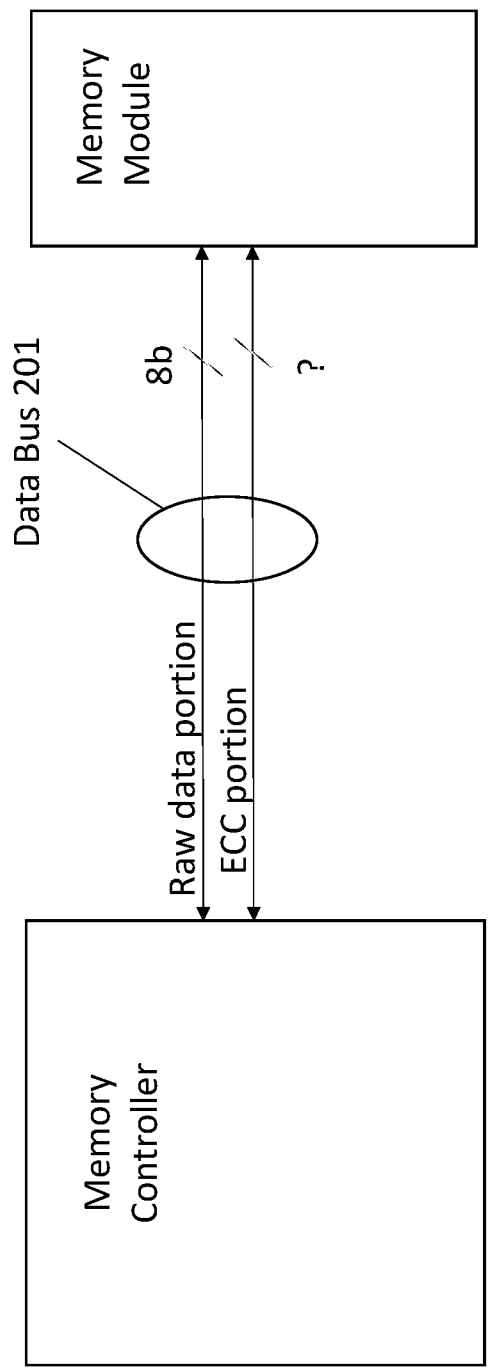

In the case of the PUMA approach, as observed in FIG. 2a, main memory accesses are implemented as bursts of eight transfers, where each transfer includes 8b of raw data for a total of 64b (8B) per burst. A problem exists, however, with respect to the ECC portion of the PUMA access model in view of commonly manufactured memory chips. Specifically, individual memory chips are available in "X4" and "X8" versions. An X4 memory chip has a four bit data bus. An X8 memory chip has an eight bit data bus. Thus, for instance, the traditional main memory data bus of FIG. 1 could be implemented with nine X8 memory chips (eight chips for raw data and one chip for ECC), or, eighteen X4 memory chips (sixteen chips for raw data and two chips for ECC).

Figure 2B:
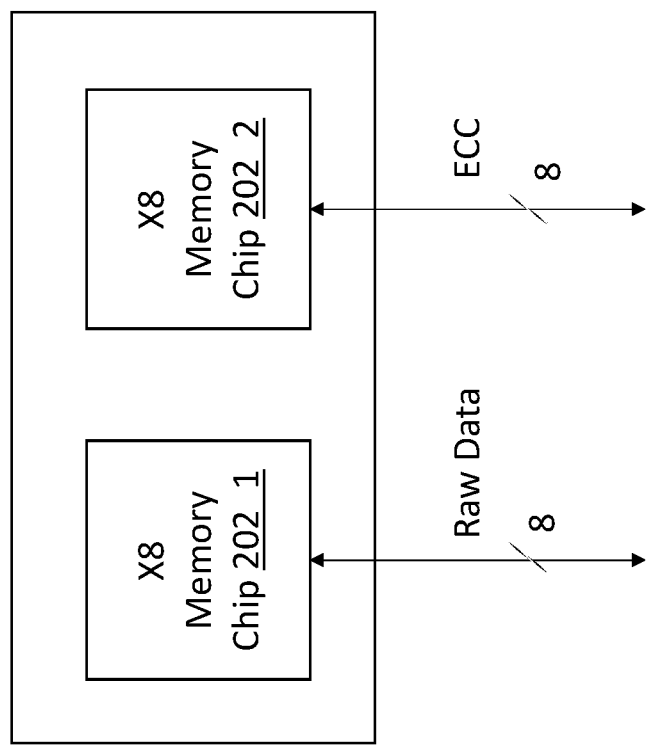

Generally, system designers strive to keep the amount of ECC overhead low. That is, for a same ECC encoding algorithm, a smaller amount of memory chip resources devoted to storage of ECC information is preferable over a greater amount of memory chip resources. FIG. 2b shows a possible rank of memory chips for a PUMA implementation with X8 memory chips. As is known in the art, a rank of memory chips is a set of memory chips that can support (or be targeted by) a burst access. As observed if FIG. 2b, the ECC overhead is 100%. That is, there is one X8 memory chip 202_1 to store all the raw data for the memory channel and another X8 memory chip 202_2 to the store the ECC information. Here, the X8 memory chip 202_1, by itself, can handle all the raw data traffic for a PUMA access transaction (8 bits per transfer×8 transfers). As such, in a X8 memory chip implementation, an entire second chip 202_2 needs to be used to store the ECC information.

One PUMA approach offers to compress data into a smaller footprint so that the second chip 202_2 need not be used. Here, ECC bits are stored in the first chip 202_1 in remaining space that exists after compression of the raw data to something less than 64b. However, although this approach can work for some data patterns it will not work for all data patterns. As such, the second memory chip 202_2 will still be needed at least for those data patterns that cannot be compressed into the smaller footprint. Additionally, those data patterns that can be compressed into the smaller footprint are apt to receive less ECC coverage than those data patterns that cannot be compressed (in the case of compression, fewer ECC bits are "jammed" into the modest space that is opened up in the payload by the compression).

Figure 3:
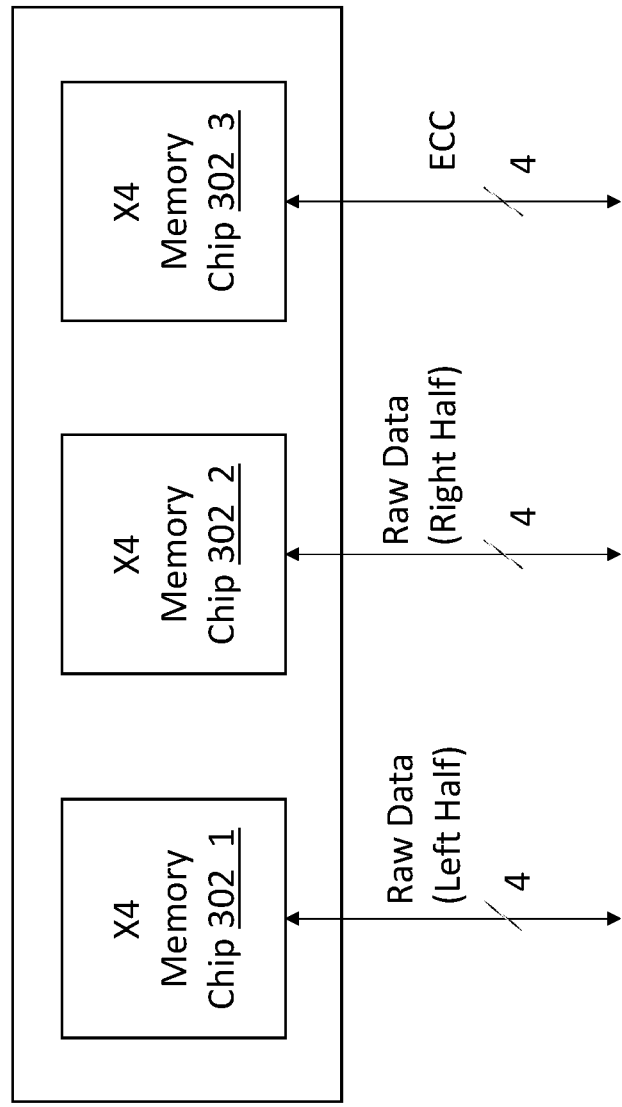
FIG. 3 shows a rank of memory chips for a PUMA memory channel.

As such, a better solution, as observed in FIG. 3, is to implement rank of memory chips for a PUMA channel with X4 memory chips. As observed in FIG. 3, with X4 memory chips, two memory chips 302_1, 302_2 are used to store raw data and one X4 memory chip can be used to store ECC information. In this case, ECC overhead is drastically reduced to 50%. Here, a nominal PUMA memory burst access includes eight transfers where each transfer includes 8b of raw data and 4b of ECC information. As such, per burst transaction, there are 64b of raw data and 32b of ECC information. Thus, there is the same amount of ECC protection regardless of the raw data pattern, and, moreover, the amount of ECC protection is adequate. Some exemplary ECC striping approaches are described in more detail below with respect to FIGS. 5a and 5b.

As is known in the art, the Joint Electron Device Engineering Council (JEDEDC), promulgates memory channel interface specifications for adaptation by computer and other electronic equipment manufacturers. JEDEC emphasizes a memory access technique, referred to as a dual data rate (DDR) in which data transfers are entertained on both the rising and falling edges of a transfer clock. The accepted nomenclature for JEDEC specifications is to number them in order as they are released (e.g., DDR3, DDR4, DDR5, etc.). The most recent JEDEC DDR specifications correspond to DDR4 and DDR5.

According to a first embodiment, the rank of FIG. 3 is implemented with DDR4 X4 memory chips, while, according to a second embodiment, the rank of FIG. 3 is implemented with DDR5 X4 memory chips. As is known the art, both DDR4 and DDR5 are directed to traditional computer systems that access main memory in bursts of 64B CPU cache lines. As such, DDR4 nominally specifies eight transfers per burst of 64b of raw data (=64B total per burst), while, DDR5 nominally specifies sixteen transfers per burst of 32b of raw data (also=64B total per burst).

Therefore, X4 memory chips designed to comply with the DDR4 standard nominally support eight cycle bursts whereas X4 memory chips designed to comply with the DDR5 standard nominally support sixteen cycle bursts. Importantly, however, the DDR5 standard also supports a burst "chop" mode in which bursts are performed in eight cycles rather than sixteen cycles.

As mentioned above, a rank is a group of memory chips that are accessed together to support a memory access burst over a single memory channel. As such, the memory solution of FIG. 3 depicts a single rank of memory chips for a PUMA channel. In various embodiments the single rank is composed of X4 DDR4 memory chips, which, as described just above, operate nominally according to a burst length of eight transfers. In alternative embodiments, the single rank is composed of X4 DDR5 memory chips. However, in order to adhere to the PUMA architecture of a burst length of eight transfers, the DDR5 memory chips operate the burst in chop mode rather than their nominal sixteen transfers per burst.

The rank of FIG. 3 can be implemented on, e.g., a dual-in-line memory module (DIMM) that plugs into the memory channel wiring of a motherboard of a computer. In the case of a single rank DIMM, only one instance of the rank of FIG. 3 is implemented on the DIMM. In the case of a dual rank DIMM, two instances of the rank of FIG. 3 are implemented on the DIMM. Here, typically, if multiple ranks are implemented on a same DIMM, the data bus wires of both ranks are logically tied together (e.g., DQ_0 of rank_0 is tied to DQ_0 of rank_1, DQ_1 of rank_0 is tied to DQ_1 of rank_1, etc.).

Control signals (not shown in FIG. 3) are also, for the most part, logically tied together with the exception, e.g., of a chip select (CS) control signal that is used to establish which rank on the DIMM is targeted by the host for the burst transaction. Other memory modules are also possible (such as a stacked memory chip memory module) with varying numbers of ranks per module. Memory modules of more than two ranks per module (e.g., three ranks per module, for ranks per module, etc.) are also possible.

Figure 4A:
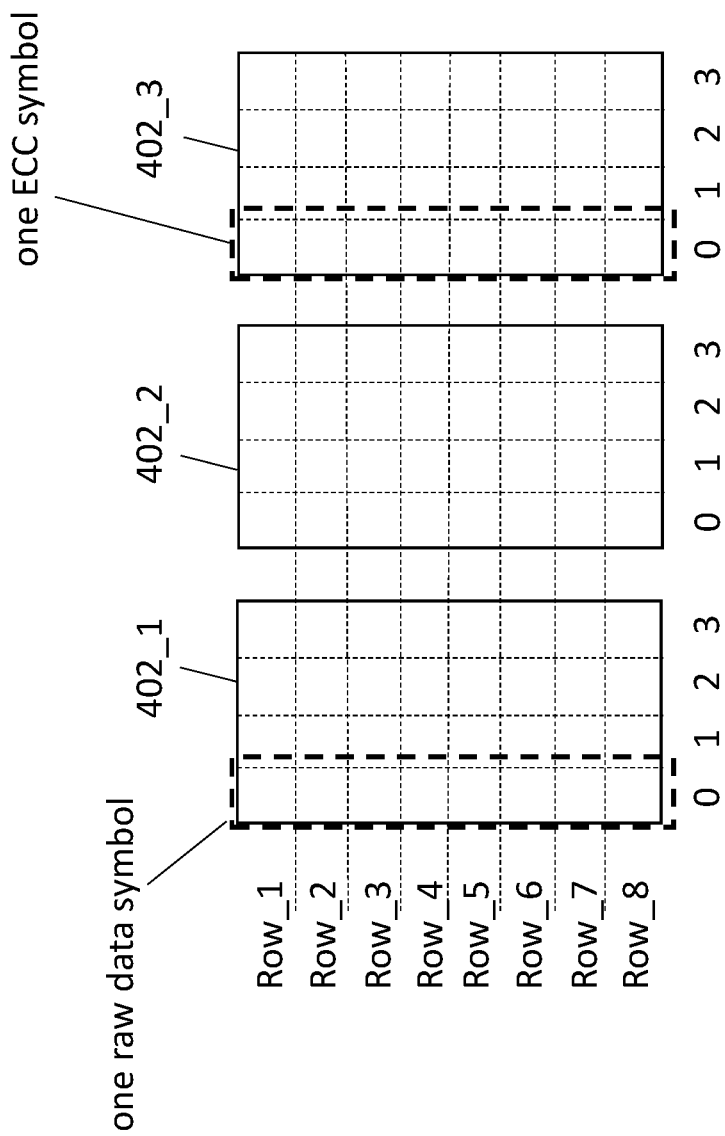
FIGS. 4a and 4b show different ECC structural schemes.
Figure 4B:
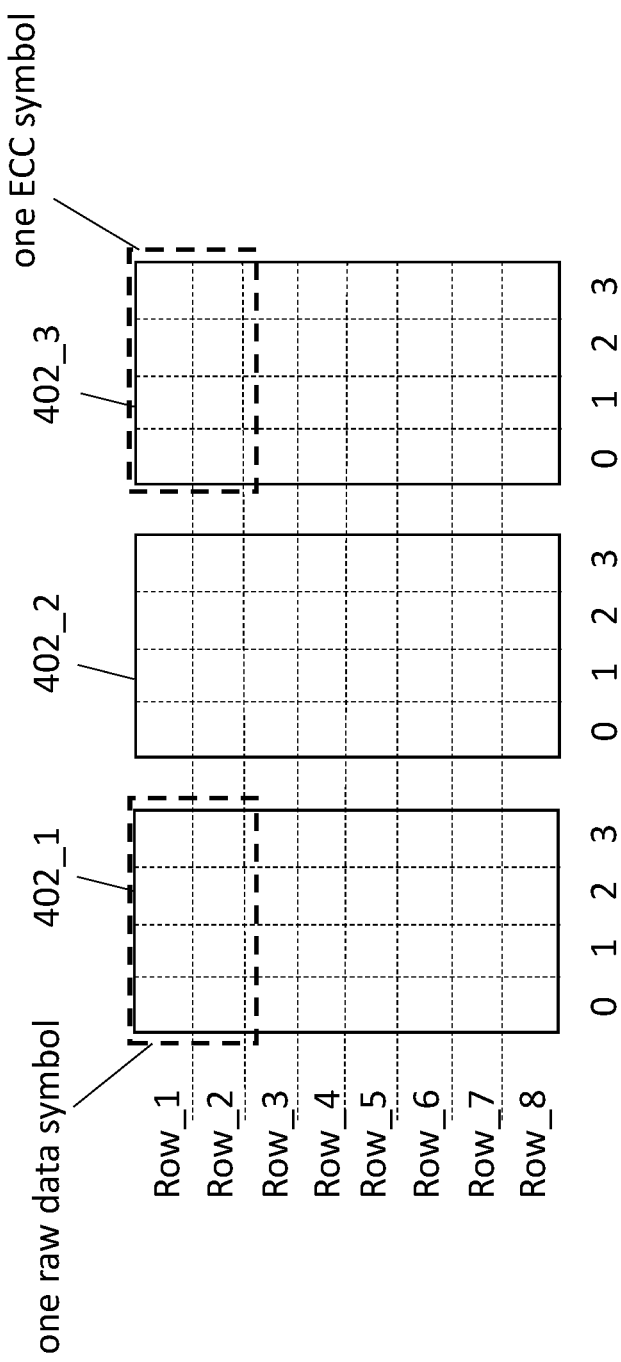

FIGS. 4a and 4b depict two different approaches for striping ECC information in the third memory chip 302_3 in the memory chip rank for the PUMA implementation of FIG. 3. Here, in FIGS. 4a and 4b, chip 402_1 corresponds to the first X4 memory chip that stores the 4b "left half" of an 8b raw data transfer, chip 402_2 corresponds to the second X4 memory chip that stores the 4b "right half" of an 8b raw data transfer and chip 402_3 corresponds to the third X4 memory chip that stores ECC information. Here, row 1 corresponds to the 8b of raw data and 4b of ECC information that are transferred during a first of eight transfers in a burst, row 2 corresponds to the 8b of raw data and 4b of ECC information that are transferred during a second of eight transfers in a burst, etc.

Generally speaking, ECC algorithms generate ECC bits be performing numerically intensive calculations on the data being protected. The ECC information is then stored with the raw data. Subsequently, when the data is read back, both the raw data and stored ECC information are retrieved. The ECC computation is performed again on the just received raw data. If the newly calculated ECC information matches the ECC information that was stored with the raw data, then, the just read raw data is understood to not contain any data corruptions.

If, however, the newly calculated ECC information does not match the ECC information that was stored with the raw data, a data corruption is understood to exist in the raw data and/or ECC information. However, if the amount of actual data corruption is beneath some threshold, the corrupted bits can be fixed. If the amount of corruption is at or beyond the threshold, the errors cannot be corrected but at least the existence of errors is known and an error flag can be raised in response.

In general, ECC algorithms break down both the raw data to be protected and the ECC information that is generated from the raw data into symbols. Symbols are a group of bits within the raw data or ECC information that act as units within the ECC algorithm. Generally speaking, error recovery processes can recover all raw data and ECC symbols so long as the total number of corrupted raw data symbols and ECC symbols remains below some threshold. The threshold number of corrupted symbols depends on the ECC algorithm used and the ratio of ECC information to raw data information (generally, the higher the ratio, the higher the threshold of corrupted symbols that can be tolerated).

Interestingly, different memory chip manufacturers will exhibit different data corruption patterns. That is, for instance, a first memory chip manufacturer will exhibit repeated errors over a sequence of burst transfers on a same data pin but not across multiple data pins (e.g., data pin D0 is always corrupted on repeated transfers but data pins D1, D2 and D3 remain uncorrupted on these same transfers). By contrast, a second memory chip manufacturer will exhibit errors across multiple data pins on a same burst transfer but other transfers of the burst remain uncorrupted across all data pins (e.g., data pins D0, D1 and D2 are corrupted on one transfer of a burst but all other transfers of the burst remain uncorrupted across each of the D0 through D3 data pins). These observed differences in error patterns across manufacturers are attributable, e.g., to the difference in the designs and/or manufacturing processes of the manufacturers' respective chips.

The different ECC encoding approaches of FIGS. 4a and 4b define symbols differently with the idea that memory chip manufacturers of one type described just above will induce fewer corrupted symbols with one of the ECC encoding approaches, whereas, manufacturers of the other type described just above will induce fewer corrupted symbols with the other of the ECC encoding approaches.

Specifically, the ECC encoding approach of FIG. 4a defines symbols "length-wise" (symbol data flows through a same data pin of a memory chip) so that manufacturers who exhibit errors according to the first pattern described above (e.g., errors appear on one data pin but not across other data pins during a burst). As observed in FIG. 4a, there are twelve 8b symbols that run vertically along the columns of FIG. 4a. Eight of the symbols are raw data symbols while four of the symbols are ECC symbols. In this case, for example, if only one data pin of the rank of three memory chips exhibits errors during a burst, only one symbol is affected and all of the errors can be recovered.

By contrast, the ECC encoding approach of FIG. 4b defines symbols "cross-wise" (symbol data flows across multiple data pins) so that manufacturers who exhibit errors according to the second pattern described above (e.g., errors appear across data pins during a particular transfer of a burst but not across other transfers of the burst). Again, there are eight raw data symbols and four ECC symbols. In this case, if multiple data pins of one memory chip of the rank of memory chips exhibit errors during only one transfer of a burst, only one symbol is affected and all the errors can be recovered.

According to either of these ECC encoding structures, Reed-Solomon ECC encodings are believed to be readily derivable that can recover errors if up to two symbols are corrupted according to the rank structure of FIGS. 3, 4a and 4b. Additionally, such algorithms will be able to particularly identify up to four specific symbols that are corrupted.

Figure 5:
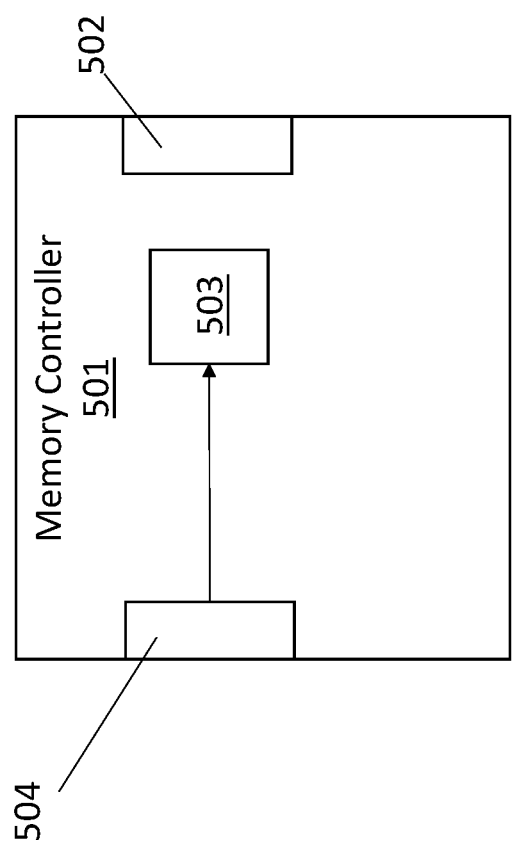
FIG. 5 shows a memory controller.

FIG. 5 shows an embodiment of a memory controller 501 that is designed to interface with at least one memory rank designed according to the rank embodiment of FIG. 3 and that creates ECC information in accordance with the embodiments of FIGS. 4a and 4b. As observed in FIG. 5, the memory controller 501 includes either or both DDR4 and DDR5 memory channel interface(s) 502 and ECC generation logic circuitry 503 for preparing ECC information according to both of the structures observed in FIGS. 4a and 4b. Additionally, the memory controller 501 includes configuration register space 504 that instructs the memory controller which type of ECC structure is to be applied (that of FIG. 4a or that of FIG. 4b).

Here, if the memory controller 501 is known to be coupled to a rank of memory chips that exhibit one type of error pattern, the memory controller is configured (e.g., with low level software/firmware of the memory controller's computer system) to apply the appropriate ECC encoding structure that minimizes corrupted symbols in view of the type of error pattern. Depending on implementation, such configuration can be made on a channel by channel basis (e.g., so that the ECC encoding structure for different channels can be optimized even if the different channels are coupled to respective ranks having memory chips that exhibit different error types of error patterns).

In still yet other implementations, some portion of the total memory space that the memory controller controls is allocated to a GPU and the memory controller 501 accesses this memory space according to the PUMA architecture (e.g., the memory space that is allocated to the GPU includes a PUMA memory channel) and corresponding rank structure of FIG. 3. At the same time, another portion of the total memory space is allocated to one or more CPU processing cores and the memory controller 501 accesses this other portion according to a traditional CPU cache line access burst process (e.g., eight transfers of 64 bits of raw data per burst to/from a rank, sixteen transfers of 32 bits of raw data per burst to/from a rank, etc.). For example, traditional DDR4 and DDR5 memory channels can be used. As such, for instance, one set of memory channel I/Os that emanate from the memory controller 501 can be used to implement the first portion of memory space, whereas, another set of memory channel I/Os that emanate from the memory controller 501 can be used to implement the second portion of memory space.

The memory controller 501 generally includes logic circuitry to perform any/all of the communications with memory chips as described above.

Figure 6:
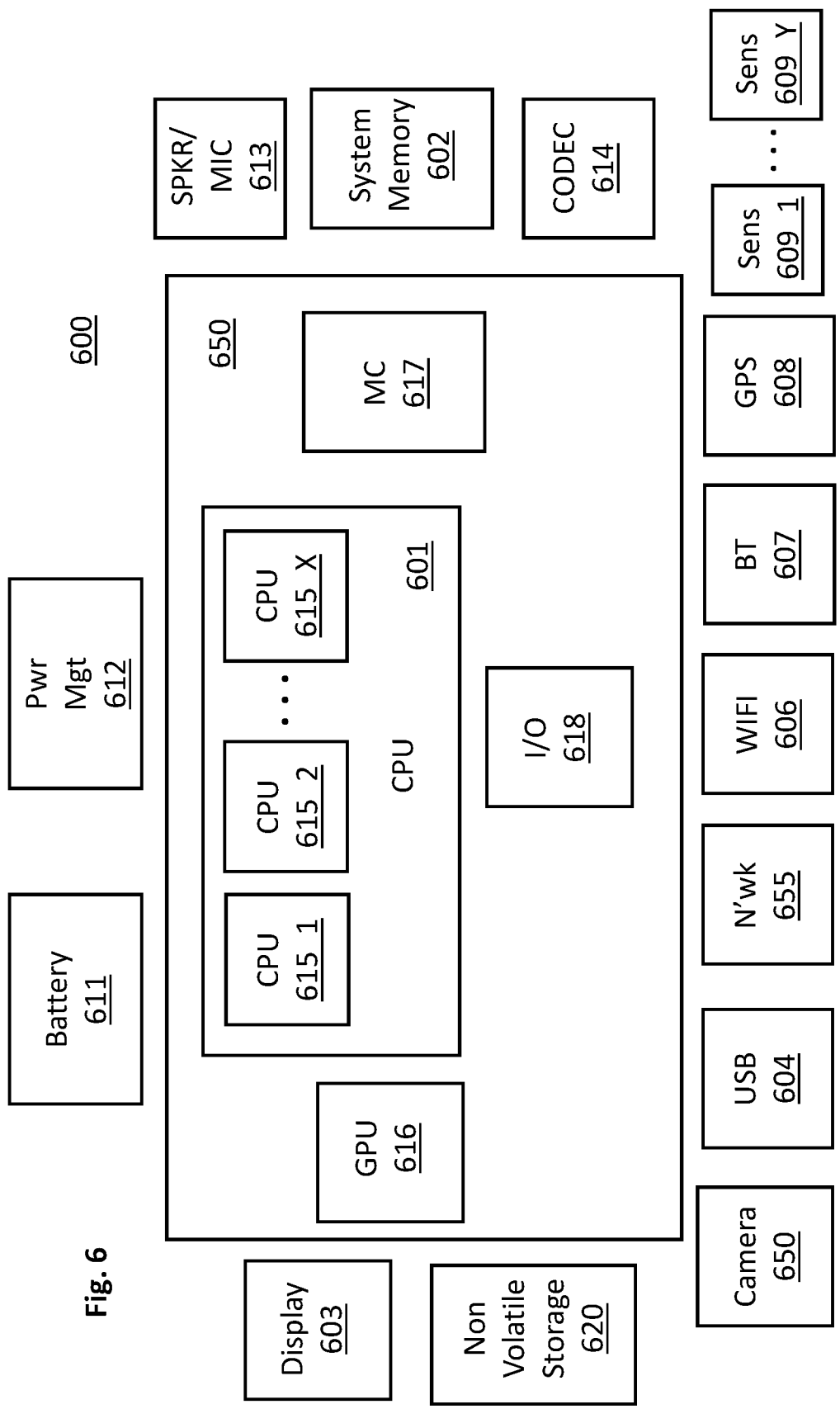
FIG. 6 shows a computing system.

FIG. 6 provides an exemplary depiction of a computing system 600 (e.g., a smartphone, a tablet computer, a laptop computer, a desktop computer, a server computer, etc.). As observed in FIG. 6, the basic computing system 600 may include a central processing unit 601 (which may include, e.g., a plurality of general purpose processing cores 615_1 through 615_X) and a main memory controller 617 disposed on a multi-core processor or applications processor, system memory 602, a display 603 (e.g., touchscreen, flat-panel), a local wired point-to-point link (e.g., USB) interface 604, various network I/O functions 605 (such as an Ethernet interface and/or cellular modem subsystem), a wireless local area network (e.g., WiFi) interface 606, a wireless point-to-point link (e.g., Bluetooth) interface 607 and a Global Positioning System interface 608, various sensors 609_1 through 609_Y, one or more cameras 610, a battery 611, a power management control unit 612, a speaker and microphone 613 and an audio coder/decoder 614.

An applications processor or multi-core processor 650 may include one or more general purpose processing cores 615 within its CPU 601, one or more graphical processing units 616, a memory management function 617 (e.g., a memory controller) and an I/O control function 618. The general purpose processing cores 615 typically execute the operating system and application software of the computing system. The graphics processing unit 616 typically executes graphics intensive functions to, e.g., generate graphics information that is presented on the display 603. The memory control function 617 interfaces with the system memory 602 to write/read data to/from system memory 602. The power management control unit 612 generally controls the power consumption of the system 600.

Each of the touchscreen display 603, the communication interfaces 604-607, the GPS interface 608, the sensors 609, the camera(s) 610, and the speaker/microphone codec 613, 614 all can be viewed as various forms of I/O (input and/or output) relative to the overall computing system including, where appropriate, an integrated peripheral device as well (e.g., the one or more cameras 610). Depending on implementation, various ones of these I/O components may be integrated on the applications processor/multi-core processor 650 or may be located off the die or outside the package of the applications processor/multi-core processor 650.

The computing system also includes non-volatile storage 620 which may be the mass storage component of the system. Here, for example, the mass storage may be composed of one or more SSDs that are composed of FLASH memory chips whose multi-bit storage cells are programmed at different storage densities depending on SSD capacity utilization as described at length above.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
   a rank of memory chips to couple to a memory channel, the memory channel characterized as having eight transfers of eight bits of raw data per burst access, the rank of memory chips comprising first, second and third X4 memory chips, the X4 memory chips conforming to a JEDEC dual data rate (DDR) memory interface specification, the first and second X4 memory chips are to couple to an eight bit raw data portion of the memory channel's data bus, the third X4 memory chip to couple to an error correction coding (ECC) information portion of the memory channel's data bus.

2. The apparatus of claim 1 wherein the X4 memory chips are X4 DDR4 memory chips.

3. The apparatus of claim 2 wherein the rank of memory chips is disposed on a dual in-line memory module.

4. The apparatus of claim 1 wherein the X4 memory chips are X4 DDR5 memory chips.

5. The apparatus of claim 4 wherein the eight data transfers per burst access are to be performed in a chop mode.

6. The apparatus of claim 4 wherein the rank of memory chips is disposed on a dual in-line memory module.

7. The apparatus of claim 1 wherein the ECC information portion of the memory channel's data bus is to transport an entire symbol of ECC information across data pins of the third X4 memory chip.

8. The apparatus of claim 1 wherein the ECC information portion of the memory channel's data bus is to transport an entire symbol of ECC information over a single data pin of the third X4 memory chip.

9. A computing system, comprising:
   a plurality of CPU processing cores;
   a graphics processing unit;
   a memory controller, a memory channel emanating from the memory controller, the memory channel characterized as having eight transfers of eight bits of raw data per burst access, a memory module coupled to the memory channel, the memory module comprising a rank of memory chips, the rank of memory chips comprising first, second and third X4 memory chips, the X4 memory chips conforming to a JEDEC dual data rate (DDR) memory interface specification, the first and second X4 memory chips to couple to an eight bit raw data portion of the memory channel's data bus, the third X4 memory chip to couple to an error correction coding (ECC) information portion of the memory channel's data bus.

10. The apparatus of claim 9 wherein the X4 memory chips are X4 DDR4 memory chips.

11. The apparatus of claim 10 wherein the memory module is a dual in-line memory module.

12. The apparatus of claim 9 wherein the X4 memory chips are X4 DDR5 memory chips.

13. The apparatus of claim 12 wherein the eight data transfers per burst access are to be performed in a chop mode.

14. The apparatus of claim 13 wherein the memory module is a dual in-line memory module.

15. A memory controller, comprising:
   an interface to communicate with a memory chip that conforms to a JEDEC dual data rate (DDR) memory interface specification, the memory controller comprising logic circuitry to:
   access memory chips that conform to the JEDEC DDR interface specification with eight transfers of eight bits of raw data and four bits of ECC information per burst access;
   calculate ECC information from a burst access's raw data with a symbol orientation that is based on a manufacturer of the memory chips.

16. The memory controller of claim 15 wherein a first ECC symbol orientation comprises orienting symbols length-wise such that a single symbol is transferred over a single data pin of any of the memory chips.

17. The memory controller of claim 16 wherein a second ECC symbol orientation comprises orienting symbols cross-wise such that a single symbol is transferred over four data pins of any of the memory chips.

18. The memory controller of claim 15 wherein the eight transfers are performed in a chop mode.

19. The memory controller of claim 15 wherein the memory controller comprises configuration register space to establish a particular one of multiple available symbol orientations.

20. The memory module of claim 15 wherein the memory controller comprises another interface to communicate with another memory chip according to a burst process that transfers a CPU cache line.

* * * * *